United States Patent [19]

Taylor

[11] Patent Number: 5,191,291

[45] Date of Patent: Mar. 2, 1993

[54] METHOD AND APPARATUS FOR DETERMINING THE PERFORMANCE CAPABILITIES OF SECONDARY BATTERIES

[76] Inventor: George Taylor, Musket La., Westford, Mass. 01886

[21] Appl. No.: 693,397

[22] Filed: Apr. 30, 1991

[51] Int. Cl.$^5$ ........................................... G01N 27/02
[52] U.S. Cl. ..................................... 324/429; 320/48; 340/636
[58] Field of Search ....................... 324/429, 431, 433; 340/636; 320/48

[56] References Cited

U.S. PATENT DOCUMENTS

| | | | |
|---|---|---|---|
| 3,876,931 | 4/1975 | Godshalk | 324/429 |
| 4,275,351 | 6/1981 | Harer et al. | 324/429 |
| 4,316,133 | 2/1982 | Locke, Jr. | 340/636 |
| 4,943,777 | 7/1990 | Nakamura et al. | 324/433 |
| 4,972,181 | 11/1990 | Fiene | 340/636 |

FOREIGN PATENT DOCUMENTS 3028560  2/1982  Fed. Rep. of Germany ...... 324/433
3808559  9/1989  Fed. Rep. of Germany ...... 324/431

Primary Examiner—Jack B. Harvey
Assistant Examiner—Maura K. Regan
Attorney, Agent, or Firm—E. T. Barrett

[57] ABSTRACT

A constant current load is cyclically applied to the battery terminals for about one minute, each load portion of the cycles having a current approximately equal to the rated ampere hour load of the battery and having a duration of about 34 milliseconds in which the load is connected for about 17 milliseconds and disconnected for an equal period. The load current is approximately equal to the rated ampere load of the battery under test. An output indicator denotes the final terminal voltage under load as a percentage of a reference voltage equal to the terminal voltage of an ideal battery of the same kind when fully charged and first subjected to a load equal to the load used in the testing procedure. A battery with an output indication between 90 and 110 is deemed to be acceptable. A lower reading indicates the battery is either undercharged or defective.

15 Claims, 1 Drawing Sheet

METHOD AND APPARATUS FOR DETERMINING THE PERFORMANCE CAPABILITIES OF SECONDARY BATTERIES

BACKGROUND OF THE INVENTION

1. Field of the Invention

This invention relates to battery testers and more particularly to a method and apparatus for measuring the capability of a re-chargeable battery to deliver its rated power.

2. Description of Related Art

Battery testers for lead-acid batteries have a long and complex history. There is much confusion over the purpose of such testers, how they operate and the ultimate function of the tester. Many testers merely measure the voltage delivered by a battery under load conditions. Most such testers do not even provide a constant load but merely load the battery with an element whose resistance is subject to change with environmental conditions and which produces a variable load current with change in battery voltage. The operation of lead-acid batteries in particular is complex and subject to erratic variations from a myriad of causes.

In some situations, merely determining whether a battery is fully charged is an adequate test. For many applications, particularly where batteries are used as a back-up power source for life safety equipment or have been in storage for a considerable period of time, it is not enough to know only that the battery is fully charged, for a battery may exhibit the correct voltage at its terminals, or even deliver the rated load for a short period of time, but be incapable of delivering full power over a longer period. The accepted way of testing, for example lead-acid batteries, is to place a rated load on the battery for a specified time period. For example a battery rated at 20 ampere-hours would have load of one ampere applied to it for 20 hours. The terminal voltage would be measured at the end of the period as a measure of the capability of the battery. But such a testing period is totally impractical for routine battery checks in operating systems.

Even in emergency lighting systems, it is usual to test the condition of the back-up battery supply by merely switching the light circuit to the battery supply. If the lights operate, it is assumed the battery supply is functional. This may not be true. A battery may have sufficient stored energy to provide the desired light intensity for a short period of time but be incapable of longer term operation.

U.S. Pat. No. 2,864,055 to Kordesch et al. describes a system in which a battery is periodically charged for a predetermined period and the difference in terminal voltage at the beginning and end of the charge is compared with batteries of known capacity subjected to an identical charging cycle.

U.S. Pat. No. 3,392,328 to Figg describes a battery testing method in which a storage battery is discharged for a predetermined period of time followed by a period of charging. The terminal voltage of the battery is measured immediately following the discharge cycle and again following the charging cycle. The difference between these two voltages is compared with voltages from other batteries whose power capabilities are known.

U.S. Pat. No. 3,500,167 to Appelgate et al. describes an electronic testing device in which the battery is charged and discharged in accordance with a pre-set sequence. The terminal voltage of the battery is measured at various points in the charging and discharging cycles and these values are compared with values based on batteries with known operational capabilities. The charging and discharging cycles are shorter than in the systems described above, but are relatively long. For example, the discharge cycle may be of the order of sixteen seconds followed by a rest period of some seven seconds. In other variations of the testing procedure significantly longer cyclic periods are used.

U.S. Pat. No. 3,593,099 to Scholl describes an automatic battery discharger and tester in which the test battery is discharged with a constant load and the terminal voltages continually monitored and compared with current and voltage values derived from batteries of known capability. The load is maintained on the battery until it reaches a substantially discharged condition.

U.S. Pat. No. 3,680,072 to Charbonnier et al. describes an apparatus for monitoring the charge condition of a battery. A current pulse is passed through the internal resistance of the battery and the change in terminal voltage is monitored. The device indicates when a battery has reached a minimum level of discharge and initiates a recharging cycle. The fully charged condition of the battery is determined by the voltage across the battery terminals.

U.S. Pat. No. 3,808,487 to Feuillade describes a method of charging a battery and determining the fully charged condition by measuring the results of a pulse passed through the battery that is said to measure the "operational impedance" of the battery.

U.S. Pat. No. 3,857,087 to Jones describes a number of methods for evaluating the capabilities of a storage battery. One method applies successive high current charging pulses to the battery and the current at the end of each pulse is monitored. The battery is apparently deemed to be defective if the current at the end of a second pulse is less than the current monitored at the end of the preceding pulse. Another proposed test consisted of discharging the battery through a constant resistance for five seconds, determining the battery voltage at the end of the period. A high current pulse is then passed through the battery and the "final current of the current transient" is measured. The measured voltage and the final current are compared with reference values from good batteries. Still another test is described in which a high current charging pulse is applied, measuring "the final current of current transient monitored" then discharging the battery for five seconds through a fixed resistance, delaying thirty seconds and then applying a high current charging pulse and measuring the "final current of the second current transient monitored". Another procedure consists of applying a "high current transient monitored), delaying five seconds and then discharging the battery for five seconds and monitoring, not the voltage, but the polarization at the end of the discharge. The final current transient and polarization are compared to reference values."

U.S. Pat. No. 4,053,824 to Dupuis et al. discloses a method of checking a number of battery cells connected in series. The battery cells are first charged and then allowed to remain dormant for a period up to ten hours. An "elementary transient open circuit voltage" is then measured for each cell and this voltage is compared with the average transient terminal voltages of all of the other cells. If the difference is greater than a predetermined amount, the cell being examined is presumed to be defective.

U.S. Pat. No. 4,080,560 to Abert describes a system for checking the condition of a battery by measuring (a) the no-load terminal voltage, (b) measuring the terminal voltage about 15 seconds after a heavy current load is connected to the battery, and (c) removing the current load and about 100 msec thereafter measuring a first recovery voltage, and (d) one second later again measuring the recovery voltage. A "qualitative" comparison of these measurements with predetermined reference voltages is made with "a logical evaluation" of the comparison results.

U.S. Pat. No. 4,180,770 to Eby describes a system for making certain measurements on storage batteries in which the value of the initial open circuit terminal voltage is stored in a comparison device. Thereafter, throughout the discharge period, the open circuit voltages are determine by measuring "loaded voltages with reference to the stored open circuit voltages to detect the discharge rates." The rates of discharge are used to reset the stored value of the initial open circuit voltage measurement to produce a moving reference. It is stated that the battery capacity is measured by the "memory output value". During the charge period, the "charge voltages" are measured with reference to the stored open circuit voltages to detect charge rates.

U.S. Pat. No. 4,361,809 to Bil et al. describes a battery quality determination in which the results are said to be substantially independent of battery size and temperature. The diagnostic cycle includes a discharge cycle followed by five charging pulses and a second discharge cycle. Various voltages derived during this cycle are compared with values obtained from batteries of known capacity.

These references serve to illustrate the confused and variable approaches that have been taken in an effort to provide a practical method of measuring the quality of a rechargeable battery. None of these procedures, however, has served to displace the standard accepted method of testing which is to apply a rated load to the battery for many hours.

SUMMARY OF THE INVENTION

The present invention provides a quick and reliable method and apparatus for measuring the capability of a battery to deliver its rated power output without requiring any charging operation. The entire test procedure requires approximately one minute and delivers a positive indication of the capability of the battery that correlates well with the data obtained from standard evaluations requiring many hours. The test makes no effort to distinguish between a defective battery and a discharged battery, it determines only whether a particular battery in its current condition is capable of delivering its rated power output.

A constant load is cyclically applied to the battery terminals for the test period. The load is electronically controlled to maintain a constant current during the test period and is approximately equal to the rated ampere-hour capacity of the battery. The load is applied to the battery at a cyclic rate between about ten and fifty Hz, with 29 Hz being the preferred rate. In a typical operation, the load is applied for successive periods of 17 milliseconds with intervening recovery periods of equal duration.

An initial reference voltage is established from known characteristics of the type of battery being tested. It is known for batteries of each type and voltage, what the terminal voltage will be of a good and fully-charged battery under a specified current load when the load is first connected. This value pre-programmed into the tester as an initial reference voltage. If this voltage is not known, it can be determined by testing one or more fully charged batteries, at a specified temperature, known to be capable of delivering the rated ampere-hour load. The current load that is to be used in the test procedure is connected to the battery and the terminal voltage immediately measured. This provides the initial reference voltage which is the voltage to be expected from a good battery at the time the test is initiated and the load first connected to the battery. An output indicator denotes the characteristic profile battery terminal voltage under load conditions as a percentage of the reference voltage. A battery with an output indication between 90 and 110 is deemed to be acceptable. A lower reading indicates the battery is either undercharged or defective. The method of testing described here is applicable also to individual cells and the term "battery" as used here means either a single cell or a battery comprising a number of individual cells or groups of cells.

DESCRIPTION OF THE PREFERRED EMBODIMENT(S)

Figure 1:
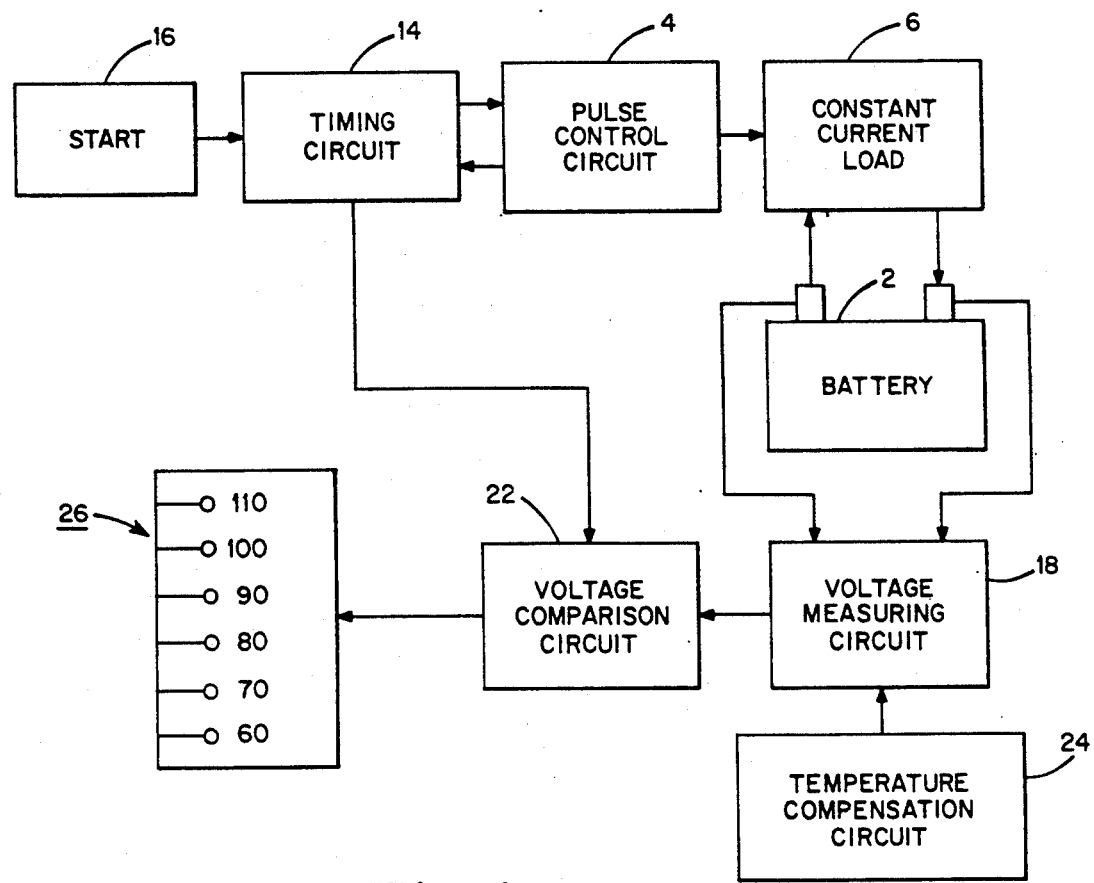
FIG. 1 is a functional block diagram of a battery testing circuit incorporating the present invention.

As functionally indicated by FIG. 1, a 24-volt lead-acid battery 2, rated at 20 ampere-hours, is connected to a constant-current load circuit 6. A pulse control circuit 4 interrupts the load circuit in a series of pulses at a rate between 10 and 50 Hz. In this particular example, the pulses have a preferred duration of 34 milliseconds, that is, during each cycle, the load 6 is connected for a period of 17 milliseconds and then disconnected for an equal time period. The load pulse cycles are continued for a period of one minute at which time the capability of the battery is indicated.

The load current from the battery should be constant and preferably is approximately equal to the ampere hour rating of the battery. For example, for a battery with a rating of 20 ampere-hours, the resistance of the load circuit is adjusted to produce a current of 20 amperes. As used herein and in the claims, "rated ampere load" means a current equal to the ampere hour rating of the battery. The load circuit 6 provides a variable resistance, as by solid state devices, that maintain a constant load current that is independent of changes in battery terminal voltage. There is, thus, some variation in output power with change in terminal voltage, but the variation does not interfere with the overall battery capability indication.

The testing cycle is controlled by a timing circuit 14 that generates a square wave that actuates the pulse control circuit 4. When a start button 16 is pressed, the timing circuit 14 connects the square waves to the pulse control circuit 4. The load circuit 6 continues to cycle with successive on-periods of 17 milliseconds and off-periods of 17 milliseconds. The terminal voltage of the battery is measured during each load portion of the cycles by a voltage measuring circuit 18. At the end of the test period which should be between 0.75 and 2.0 minutes, with about one minute being the preferred period, the timing circuit 14 causes the pulse control circuit to interrupt the load circuit. The last measured voltage is fed from the voltage measuring circuit 18 into a voltage comparison circuit 22 where it is compared with the reference voltage.

The operator programs the tester to deliver the appropriate reference voltage by adjusting conventional type manual controls (not shown) to indicate the particular type of battery and the rated terminal voltage. The appropriate reference voltages are pre-programmed into the tester and are derived from the known characteristics of each type of battery to be tested. For example, a battery in good and fully charged condition, at a known temperature, will have a known terminal voltage immediately upon the application of the same current load as is used in this test. If this value is not already known, it can be determined by testing good and fully-charged batteries of the appropriate type.

The terminal voltage of a battery and its performance characteristics are materially affected by temperature. Accordingly, in interpreting the results of the measurements, it is important to take into account the temperature of the battery at the time the test is made. This can be accomplished either by manually feeding the temperature data into the test set-up or by automatically measuring the temperature of the battery. In either case, a temperature compensation circuit 24 modifies the evaluation characteristics of the voltage comparison circuit 22 to adjust for the current battery temperature. An acid type battery at a lower temperature can be expected to exhibit a lower terminal voltage which will decrease more rapidly with load than does the same battery at a higher temperature. Accordingly, as the temperature is lowered, the ratio of the measured voltages is decreased so that the results indicator will provide the same measure of battery capability as if the battery were measured at a higher temperature.

The ratio of the last-measured terminal voltage and the reference voltage are determined as a measure of the performance capabilities of the battery. The battery profile is indicated by a capability indicator, generally indicated at 26, which consists of a series of lamps arranged to denote the results of the test. Each lamp represents a range of voltage ratios (the last measured voltage divided by the first measured reference voltage) expressed as percentage. The lamp with an output indication nearest the measured ratio is illuminated at the conclusion of the test. The arrangement permits two lamps to be illuminated simultaneously to indicate a vale between that of the two lamps to provide greater resolution. An indication between 100 and 110 indicates the battery is fully charged and is capable of delivering its rated ampere-hours. If a reading of, say, 80 is obtained, the battery may be defective, or it may only need to be fully charged to meet its performance capabilities. If the output indication is 60 or less, the battery is usually deemed to be defective and should be replaced.

The voltage measuring circuit 18, in addition to measuring the final voltage during a load cycle, additionally measures the terminal voltage during the load portion of each cycle. If the voltage drops at any time below the minimum 60% ratio, the test is automatically terminated and a defective battery indication given.

Figure 2:
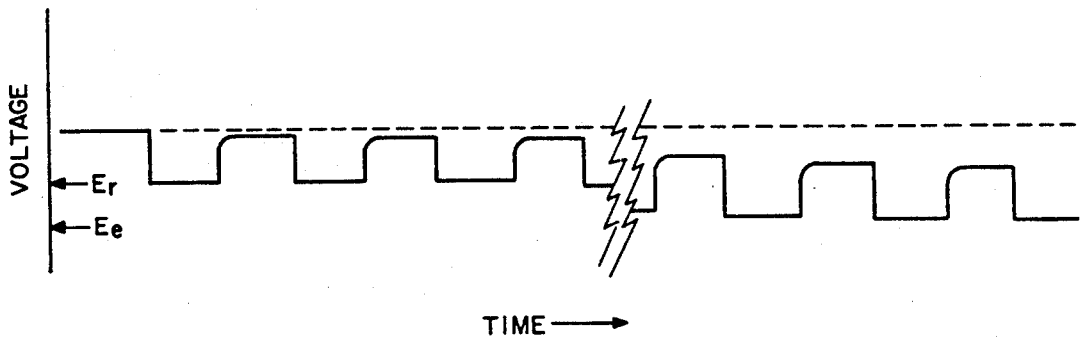
FIG. 2 is a graph of the terminal voltage of a lead-acid battery during a capability test.

FIG. 2 shows a graph of the load cycles on the battery. When the load is applied at the beginning of the cycle, the terminal voltage drops to some lower value. When the load is removed at the end of each cycle, the voltage immediately makes a partial recovery and then more gradually approaches its original value. If the battery is good and is fully charged, the recovery voltage will be substantially equal to the original no-load voltage and will remain at this level at the end of the one minute test period. However, if the battery is not fully charged or is defective, the recovery voltage will gradually decrease during the test period as indicated by the graph in FIG. 2. The reference voltage indicated at $E_r$ on the chart may be the same or different from the initial terminal voltage of the battery 2 when the load is first applied. The final voltage $E_e$ as indicated on the chart is the terminal voltage of the battery under load at the end of the test period.

In the conventional long term battery test in which the rated ampere load is applied for the rated period (for example, one ampere for twenty hours for a 20 ampere-hour battery) the terminal voltage will gradually decrease during the test period. The decrease in voltage is a function of the battery charge and condition and is also affected materially by such factors as the temperature of the battery. The results attained in one minute by the present battery tester correlate well with data from conventional tests made over the longer time period of many hours.

The functions represented in the block diagram of FIG. 2 are well known to those skilled in the art so that practical working circuits can be constructed readily.

Although the method described above is primarily directed toward secondary or re-chargeable batteries, the method may be applied to certain primary batteries in which case the load current will also be maintained at a constant value, but its magnitude will be selected in accordance with the characteristics of the particular battery being tested.

I claim:

1. The method of determining the capability of a rechargeable battery to deliver its rated load comprising the steps of
    providing a predetermined battery load,
    establishing a reference voltage representative of the terminal voltage of a good, fully-charged battery of the type being tested immediately upon being connected to a load equal to said predetermined load,
    for a predetermined time period cyclically connecting and disconnecting said predetermined load from said terminals to produce successive on-periods and off-periods, the frequency of said cyclical load being between 10 and 50 Hz,
    measuring an ending terminal voltage during an on-period at the end of said time period, and
    comparing said ending terminal voltage with said reference voltage as a measure of the capability of said battery to deliver its rated load.

2. The method as claimed in claim 1 wherein the frequency of said cyclical load is approximately 29 Hz.

3. The method as claimed in claim 2 wherein said time period is approximately one minute.

4. The method as claimed in claim 1 wherein said time period is between 0.75 and 2.0 minutes.

5. The method as claimed in claim 1 wherein the current through said load during said on-periods is between 0.5 and 1.5 times the rated ampere load of the battery.

6. The method as claimed in claim 1 wherein the current through said load during said on-periods is approximately equal to the rated ampere load of said battery.

7. The method as claimed in claim 1 including the step of
adjusting the measured ratio of said beginning and ending voltages in accordance with the temperature of said battery.

8. The method of determining the capability of a battery to deliver its rated load comprising in a single capability test the steps of
establishing a reference voltage from the known characteristics under an immediate load of a good and fully-charged battery of the type and voltage rating of the battery to be tested,
providing a constant predetermined current cyclical load coupled to the terminals of the battery,
for a predetermined time period cyclically connecting and disconnecting said load from said terminals to produce successive on-periods and off-periods, the on-periods and the off-periods each having a duration between 10 and 50 milliseconds,
measuring an ending terminal voltage during an on-period at the end of said time period, and
comparing said ending terminal voltage with said reference voltage as a measure of the capability of said battery to deliver its rated load.

9. The method as claimed in claim 8 wherein the duration of said on-periods is approximately 17 milliseconds.

10. The method as claimed in claim 8 wherein said time period is between 0.75 and 2.0 minutes.

11. The method as claimed in claim 10 wherein said time period is approximately one minute.

12. The method as claimed in claim 8 wherein said battery is a re-chargeable battery, and the current through said load during said on-periods is between 0.5 and 1.5 times the rated ampere load of the battery.

13. The method as claimed in claim 12 wherein the current through said load during said on-periods is approximately equal to the rated ampere load of said battery.

14. The method as claimed in claim 8 including the step of
adjusting the measured ratio of said reference voltage and said ending voltage in accordance with the temperature of said battery.

15. The method of determining the capability of a battery to deliver its rated load comprising the steps of
establishing a reference voltage from the known characteristics under an immediate load of a good and fully charged battery of the type and voltage rating of the battery to be tested.
providing a constant predetermined current cyclical load coupled to the terminals of the battery,
for a predetermined time period cyclically connecting and disconnecting said load from said terminals to produce successive on-periods and off-periods, the on-periods each having a duration between 10 and 50 milliseconds,
maintaining the current through said load at a constant value during said time period,
measuring an ending terminal voltage during an on-period at the end of said time period, and
comparing said ending terminal voltage with said reference voltage as a measure of the capability of said battery to deliver its rated load.

* * * * *